United States Patent [19]

Ma et al.

[11] Patent Number: 4,783,848
[45] Date of Patent: Nov. 8, 1988

[54] TVRO RECEIVER SYSTEM FOR LOCATING AUDIO SUBCARRIERS

[75] Inventors: John Y. Ma, Milpitas; David H. McCracken, San Jose, both of Calif.

[73] Assignee: Capetronic (BSR) Ltd., Kowloon, Hong Kong

[21] Appl. No.: 789,424

[22] Filed: Oct. 21, 1985

[51] Int. Cl.$^4$ ............... H04B 11/16; H04B 1/26
[52] U.S. Cl. ................... 455/182; 455/183; 455/207; 455/264; 455/315
[58] Field of Search ............ 455/182, 183, 192, 200, 455/260, 264, 265, 207, 208, 209, 315, 131; 358/195.1; 381/98

[56] References Cited

U.S. PATENT DOCUMENTS

| | | | |
|---|---|---|---|
| 3,742,361 | 6/1973 | Wason | 455/259 |
| 4,538,038 | 10/1977 | Amaya | 455/192 |
| 4,457,006 | 6/1984 | Maine | 455/264 |
| 4,542,533 | 9/1985 | Parker | 455/182 |
| 4,556,988 | 12/1985 | Yoshisato | 455/182 |
| 4,575,761 | 3/1986 | Carlson et al. | 455/182 |

OTHER PUBLICATIONS

NEC Corporation, "Bipolar Analog Integrated Circuit" brochure, No. IC-1312A Nov. 1984.

Primary Examiner—Robert L. Griffin
Assistant Examiner—Curtis Kuntz
Attorney, Agent, or Firm—Stephen G. Rudisill

[57] ABSTRACT

An improved satellite receiver system is provided which automatically locates audio signals among the various audio subcarriers received by an earth station; manual scanning of transmissions received from different transponders in order to locate audio signals embedded therein is eliminated. The improved receiver system does not require any input data characterizing the frequencies or bandwidth of the incoming audio signals and locates desired audio subcarriers in response to a command signal, without need for any manual intervention after generation of the command signal.

7 Claims, 7 Drawing Sheets

TVRO RECEIVER SYSTEM FOR LOCATING AUDIO SUBCARRIERS

BACKGROUND OF THE INVENTION

The present invention relates generally to receivers for TVRO earth stations which receive audio and video signals from a plurality of orbiting earth satellites. More particularly, the invention relates to a TVRO receiver system for locating the subcarrier frequencies for multiple audio signals included in the transmissions received from satellites having multiple transponders.

As used herein, the term audio "subcarrier" refers not only to audio carrier frequencies which are secondary to a main video carrier handled by the same transponder, but also to audio carrier frequencies used for FM transmissions in the absence of video carriers.

In satellite communication systems, a transmitting earth station generates a modulated carrier in the form of electromagnetic waves up to a satellite, forming an "uplink." The incident electromagnetic waves are collected by the satellite, processed electronically to reformat the modulated carrier in some way, and retransmitted to receiving earth stations, forming "downlinks." The earth stations in these systems basically consist of a transmitting and/or receiving power station functioning in conjunction with an antenna subsystem and form strategic parts of the satellite communication system.

A TVRO earth station typically comprises a receiving antenna such as a paraboloidal dish, a low noise block converter (or a low noise amplifier (LNA) and a down converter) located at an outdoor antenna site, and a receiver located near an indoor television set. The down converter and the receiver are usually connected by a coaxial cable.

A single transponder in a satellite can carry a color television channel, including both the video and audio information, and also several auxiliary services such as radio stations, newservice feeds, special news teletypewriter channels, high-speed stock market and commodity exchange data feeds, and/or teletext data services. A transponder normally has a usable modulating signal bandwidth of 8 to 10 MHz, and the video information normally occupies the band up to about 4.2 MHz. The audio portion of the television channel is placed on an FM subcarrier in the 5.8 to 7.4 MHz range (usually either 6.2 or 6.8 MHz), which leaves available all the other FM subcarrier frequencies located above 4.2 MHz. For example, in several of the satellites presently orbiting the earth, transponder owners feed separate audio subcarriers at 5.8, 6.2, 6.8 and 7.4 MHz. Other transponders on the same satellites carry music services at 5.58 and 5.76 MHz.

A satellite transponder may also be used to carry multiple narrow-band audio signals in place of a wide-band video signal. These audio signals may be interspersed with other types of auxiliary services, and thus the exact frequency of the audio subcarriers can vary widely among the large number of transponders presently in orbit, and new subcarriers can become available at any time as more subcarrier services are squeezed onto existing transponders and as additional satellites are placed in orbit. Moreover, there is no fixed relationship among the numerous audio signals themselves.

Current satellite receivers often include tunable audio subcarrier detectors for locating the various "hidden" audio subcarriers. Some of these receivers include a tuning knob for selecting the 6.2-MHz or 6.8-MHz subcarriers because these are two of the most commonly used frequencies. Other receivers have a tuning knob that permits the user to manually scan the FM baseband spectrum to locate the various audio subcarriers being received from each transponder; this scanning and tuning procedure must, of course, be repeated for each different transponder, which can become a tedious process when searching for the narrow-band audio signals transmitted by a number of different transponders.

SUMMARY OF THE INVENTION

It is a primary object of the present invention to provide an improved satellite receiver system which automatically locates audio subcarriers among the numerous signals received by an earth station. In this connection, a related object of the invention is to provide such an improved receiver system which is particularly useful in TVRO earth stations because it eliminates the need for the user to manually scan the transmissions received from each different transponder to locate the audio signals embedded therein.

It is another important object of this invention to provide an improved satellite receiver system which locates the audio subcarriers quickly and reliably in response to a command signal, without any further manual intervention after the command signal is generated.

A further object of the invention is to provide an improved satellite receiver system which is simple and inexpensive to implement in an otherwise standard satellite receiver, and which does not significantly affect the overall cost of the receiver system.

Yet another object of this invention is to provide an improved satellite receiver system which does not require any input data or other intelligence concerning the frequencies or bandwidths of the audio signals.

Other objects and advantages of the invention will be apparent from the following detailed description and the accompanying drawings.

BRIEF DESCRIPTION OF THE DRAWINGS

The invention and other objects and advantages thereof may best be understood by referring to the following description in conjunction with the accompanying drawings, in which.

DESCRIPTION OF THE PREFERRED EMBODIMENTS

Although the invention will be described in connection with certain preferred embodiments, it will be understood that it is not intended to limit the invention to those particular embodiments. On the contrary, it is intended to cover all alternatives, modifications and equivalent arrangements as may be included within the spirit and scope of the invention as defined by the appended claims.

Figure 1:
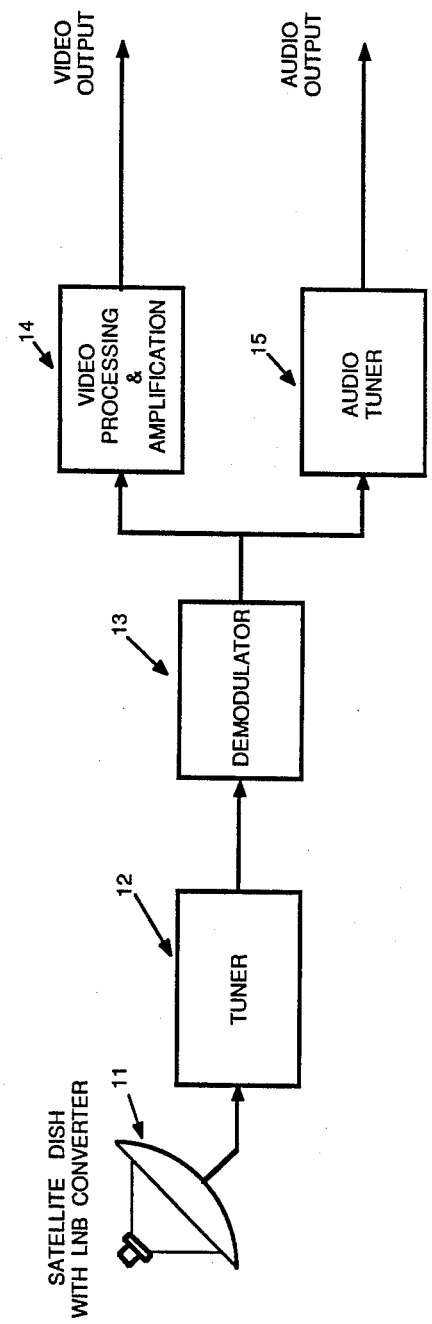
FIG. 1 is a simplified block diagram of a conventional TVRO earth station.

Referring now to the drawings, in FIG. 1 there is shown a functional block diagram of a TVRO earth station for the reception of satellite signals. The system includes an antenna 11, which is typically a paraboloidal dish equipped with a low noise block (LNB) converter and related accessories and positioning mechanisms, for capturing signals transmitted from orbiting satellites; and a receiver system including a tuner 12, a demodulator 13, a video processing and amplification section 14, and an audio tuner 15.

The antenna 11 receives signals transmitted from the satellite in the four-GHz frequency band (3.7 to 4.2 GHz); and this entire block of frequencies is converted to a 1st IF frequency range of 950 to 1450 MHz by the block converter located at the antenna site. The 1st IF signals are then sent via coaxial cable to the tuner 12 which selects a particular channel for viewing and converts the signals in that particular channel to a 2nd IF frequency range. The 2nd IF frequency range is preferably high enough to permit the 2nd IF VCO frequencies to be above the 1st IF block of frequencies, to prevent the VCO from interfering with the desired signals. For a 1st IF frequency range of 950 to 1450 MHz, this means that the center frequency of the second IF frequency range must be at least 500 MHz. A particularly preferred 2nd IF center frequency in the system of the present invention is 612 MHz In the demodulator 13, the 2nd IF signal is passed through an amplifier and a filter and on to a conventional video detector which demodulates the frequency-modulated signal to the baseband of the original video signal (e.g., 0 to 10 MHz), producing a composite video signal output. The filter preferably has a pass band that is only about 22 MHz wide; a pass band of this width passes the essential video and audio information while rejecting unwanted noise received by the antenna on the edges of the selected channel.

The output of the demodulator comprises the baseband signals which range from DC to about 8.5 MHz; this includes video information from about 15 KHz to 4.2 MHz, and subcarriers from about 4.5 to 8.5 MHz.

Figure 2:
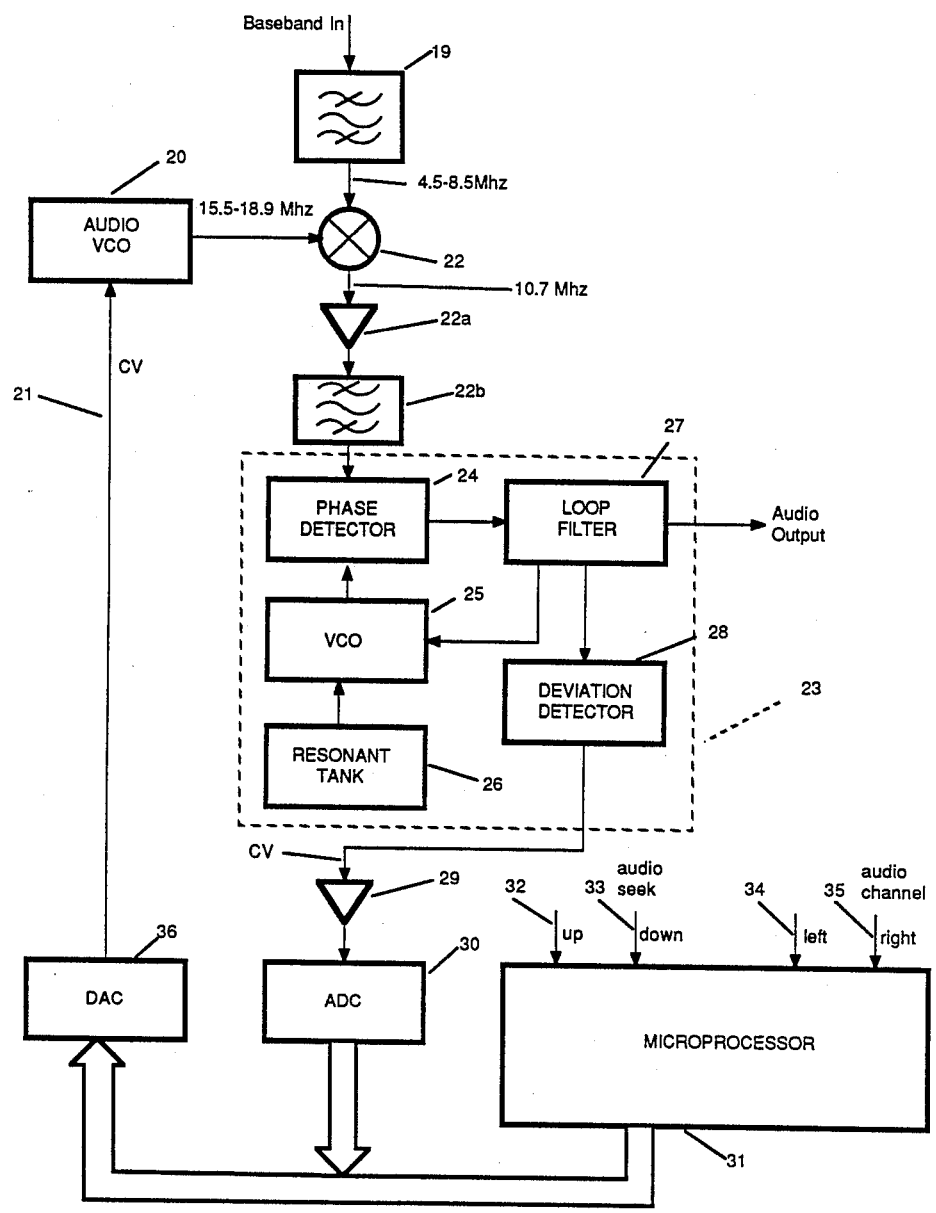
FIG. 2 is a block diagram of a preferred embodiment of the audio tuner included in the TVRO earth station of FIG. 1 and embodying the present invention.

The audio tuner 15, which is shown in more detail in FIG. 2, receives the baseband signals from the demodulator 14, which include the subcarriers above 4.5 MHz containing audio and other information. These baseband signals are initially passed through a bandpass filter 19 having a pass band of 4.5 to 8.5 MHz. The filter output is then fed to a super-heterodyne circuit including a voltage-controlled oscillator 20 (referred to hereinafter as the "audio VCO") receiving a controlling DC input voltage on line 21, and a mixer 22 for combining the output of the audio VCO with the incoming baseband signals to increase the frequency of the incoming signals to a desired intermediate frequency (audio IF) range. The output of the mixer 22 is passed through an amplifier 22a and a filter 22b to a discriminator or detector 23 which is tuned to one particular audio IF frequency.

If the audio VCO produces an output frequency 10.7 MHz above the frequency of the desired audio signal, the frequency of the desired signal will be raised to an IF center frequency of 10.7 MHz at the output of the mixer 22. The detector 23 will then produce the desired audio output if it is tuned to the IF center frequency of 10.7 MHz, which is a typical IF center frequency for FM receivers.

In the particular embodiment illustrated, the detector 23 is in the form of a phase locked loop (PLL) comprising a phase detector 24 which receives both the output from the mixer 22 and the output of a second VCO 25 operating at a fixed frequency determined by a resonant tank 26. In the particular example described above, this fixed frequency is 10.7 MHz. The pulsating DC voltage output of the phase detector 24 is filtered to a smooth DC by a low-pass loop filter 27 to produce an audio output. The loop filter is also connected to a deviation detector 28 which produces a DC error voltage EV which is proportional to any deviation of the frequency of the IF output of the mixer 22 from the fixed-frequency output of the VCO 25. This error voltage EV is normally used to adjust the input voltage to the audio VCO 20 to return the output frequency of the VCO 20 to the desired value.

The entire detector 23 is conventional and is included, for example, in the integrated circuit uPC1211V made by NEC Corporation. In this particular circuit, the error voltage EV is identified as the "AFC output" because it is the signal that is conventionally used for "automatic frequency control" by applying it to a varactor diode included in the tuning circuit of the audio VCO 20.

The system illustrated in FIG. 2 is duplicated to permi simultaneous reception of stereo broadcasts. The audio outputs of the two parallel systems are then feed to a conventional stereo processor. Such a processor is capable of processing either monaural signals or any of the three types of stereo signals currently used for stereo broadcasts via satellite, namely:

(1) The "Matrix Method", which uses two separate subcarriers, one for the left-plus-right audio signal and the other for the left-minus-right audio signal.
(2) "Multiplex Stereo", which uses an FM subcarrier for a left-plus-right audio signal, a double sideband suppressed AM subcarrier for a left-minus-right signal, and a synchronizing signal for a stereo demodulator reference.
(3) The "Discrete Method", which uses one subcarrier for the right channel, and a second subcarrier for the left channel.

In order to automatically locate the various subcarriers, the receiver system of the present invention includes means for generating an "Audio Seek" command signal, and means responsive to the "Audio Seek" command signal for (1) artificially adjusting the controlling input voltage CV to the audio VCO in a preselected direction independently of the error voltage EV, (2) monitoring the resulting error voltage EV produced by the detector 23 in response to the artificial adjustment of the controlling input voltage CV, (3) continuing to artificially adjust the voltage CV in the same preselected direction in response to monotonic changes in the resulting error voltage EV, and (4) terminating the artificial adjustments of the voltage CV in response to a non-monotonic change in the resulting error voltage EV, whereby the normal operation of the detector 23 causes the super heterodyne circuit to lock onto a new subcarrier to produce the desired audio output. Thus, in the illustrative embodiment of FIG. 2, the error voltage EV from the detector 23 is passed through a filter-amplifier 29 and an analog-to-digital converter (ADC) 30 to a microprocessor 31. As will be described in detail below, this microprocessor 31 not only adjusts the controlling input voltage to the audio VCO 20 for the normal AFC function, but also responds to an "Audio Seek" command signal (initiated by the user) to artificially adjust the controlling input voltage to the audio VCO in a preselected direction independently of the error voltage EV. These latter adjustments of the input voltage to the audio VCO are referred to herein as "artificial" adjustments because they are arbitrary adjustments which, unlike the normal AFC adjustments, have no proportional relationship to the error voltage EV.

The "Audio Seek" command signals are generated by a pair of pushbutton-actuated switches, with the pushbuttons located on the front panel of the receiver where they are accessible to the user. One of these switches commands an "up" seek via input line 32 (searching for the next higher subcarrier frequency), and the other switch commands a "down" seek via input line 33 (searching the next lower subcarrier frequency). In addition to the "Audio Seek" signals, the microprocessor receives two other user-generated command signals, for stereo transmissions; one of these signals is supplied to the microprocessor 31 via input line 34 to indicate that the signal being sought is for the "left" stereo channel, and the other signal, supplied via input line 35, indicates it is for the "right" channel.

Following each artifical adjustment of the audio VCO input voltage, the microprocessor 31 monitors the resulting error voltage EV produced in response to the artifical adjustment, and continues to artificially adjust the controlling input voltage to the IF VCO, in the same direction, in response to monotonic changes in the resulting error voltage EV. These artificial adjustments are terminated when the detector has either located a new audio subcarrier or reached the end of the audio subcarrier frequency band. As long as the error voltage EV changes monotonically in response to the artificial adjustments of the voltage CV, the detector is still trying to lock onto the previous subcarrier, i.e., a new subcarrier has not started to influence the detector. On the other hand, when the error voltage EV exhibits a non-monotonic change, i.e., goes through an inflection point, this is an indication that the detector has sensed, and is trying to lock onto, a new subcarrier. At this point, the artificial adjustments of the voltage CV are terminated, and the detector is allowed to lock onto the new subcarrier via normal AFC operation.

To determine whether the error voltages EV produced in response to successive artificial adjustments of CV are monotonic, the magnitude of EV is compared with a reference value of EV representing a centered or locked condition. This reference value will be referred to herein as "VCENTER" and is the actual value of EV when the detector 23 is locked onto a subcarrier, i.e., when the detector is receiving an input signal with a carrier frequency 10.7 MHz below the output frequency of the audio VCO 20. As long as the detector is trying to remain locked onto a given subcarrier frequency, the error voltage EV produced in response to the artificial adjustments of the control voltage CV will have a constant polarity, because the conventional AFC system will continuously try to maintain the output of the VCO 20 at a frequency 10.7 MHz above the subcarrier frequency. However, when the frequency of the VCO 20 has been artificially moved closer to a different subcarrier, the error voltage EV changes polarity because the AFC system will now try to lock onto the new subcarrier frequency by shifting the output of the VCO 20 to a frequency 10.7 MHz above the new subcarrier frequency.

For example, assuming the system is in an "up" seek mode, i.e., seeking the next higher audio subcarrier, the controlling input voltage CV to the audio VCO 20 will be artificially increased to increase the output frequency of the VCO 20. As long as the detector 23 continues to attempt to lock onto the original subcarrier frequency, the detector produces a voltage EV smaller than the reference value VCENTER in an effort to reduce the output frequency of the VCO 20. When the VCO frequency has been artificially increased to a point where it is closer to a new subcarrier than the original subcarrier, the detector produces a voltage EV larger than the reference value VCENTER in an effort to increase the output frequency of the VCO 20 because now the "lock" frequency of the VCO 20 is above, rather than below, the actual frequency of the VCO 20.

When the system is in a "down" seek mode, i.e., seeking the next lower audio subcarrier, the controlling input voltage CV to the audio VCO 20 will be artificially decreased to decrease the output frequency of the VCO 20. As long as the detector 23 continues to attempt to lock onto th original subcarrier frequency, the detector produces a voltage EV larger than the reference value VCENTER in an effort to increase the output frequency of the VCO 20. When the VCO frequency has been artificially decreased to a point where it is closer to a new subcarrier than the original subcarrier, the detector produces an error voltage EV smaller than the reference value VCENTER in an effort to decrease the output frequency of the VCO 20 because now the "lock" frequency of the VCO 20 is below, rather than above, the actual frequency of the VCO 20.

In the illustrative system, these functions are all carried out by the microprocessor 31 in response to the error voltage EV received via the ADC 30 and the aforementioned ser-initiated command signals, which are received by the microprocessor 31 via input lines 32–35. The resulting digital output signals from the microprocessor are passed through a digital-to-analog converter (DAC) 36 which furnishes corresponding DC voltages to the audio VCO 20 via input line 21. Any suitable microprocessor may be used in the illustrative system, but it is preferred to use the MC6803 microprocessor made by Motorola, Inc.

Figure 3:
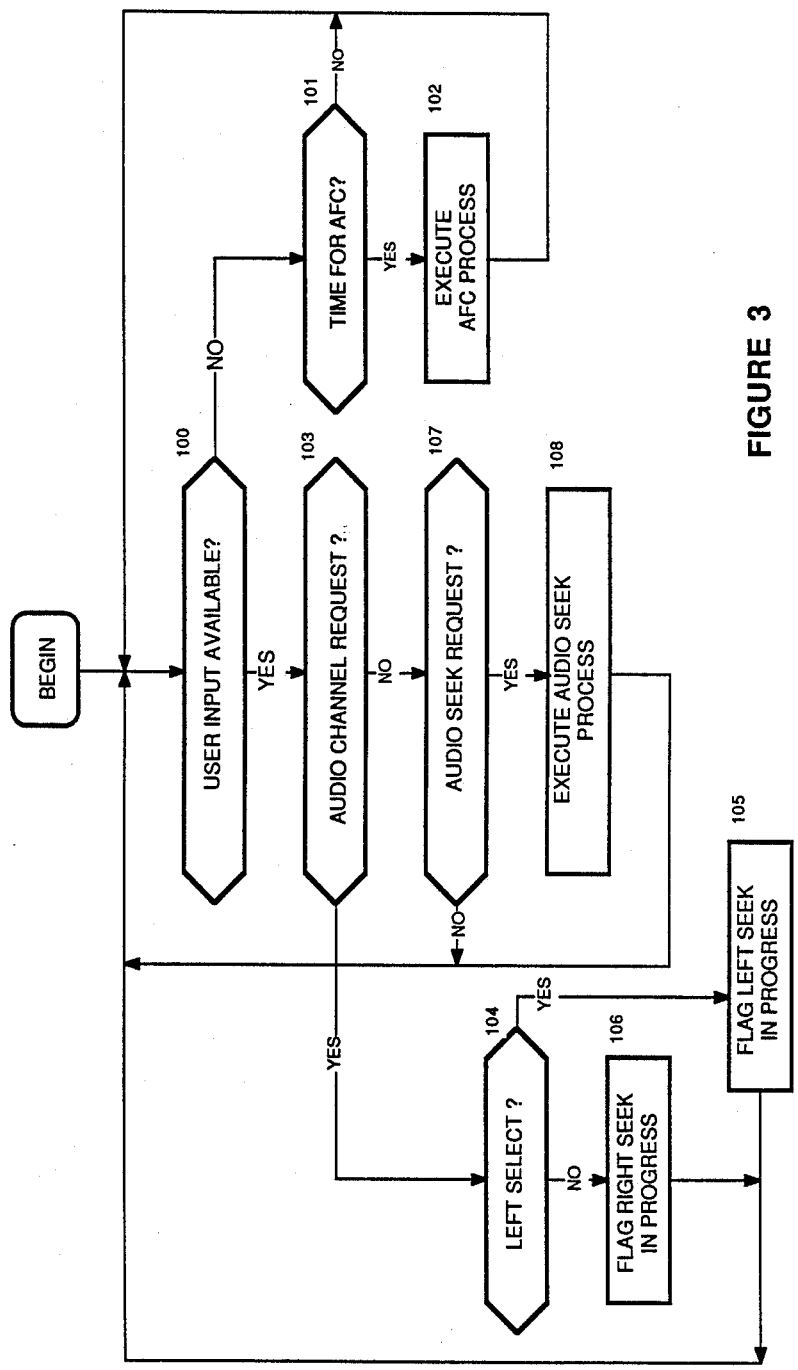
FIG. 3 is a flow chart of a software program for controlling the programmable microprocessor in the tuner of FIG. 2 to execute a "main process" subroutine.

Flow charts of exemplary software programs for controlling the microprocessor 31 to carry out the functions described above are contained in FIGS. 3 through 6. Referring to those figures, the main process illustrated in FIG. 3 is entered at step 100 which determines whether or not any user-generated input signals are present; these are the signals generated in response to manual actuation of switches on the front panel of the TVRO receiver. If a negative answer is produced at step 100, the system proceeds to step 101 which determines whether it is time to execute a standard AFC operation. Because the AFC function is controlled by the microprocessor 31 in this system, and this microprocessor is also used for a number of other functions, the AFC function is not carried out continuously but rather at preselected time intervals ΔT. Of course, these time intervals are so short that the net effect is the same as a normal continuous analog AFC function performed without the use of a microprocessor. A negative answer at step 101 returns the system to the main program, while an affirmative answer advances the system to step 102 where the AFC subroutine illustrated in FIG. 4 is executed.

Figure 4:
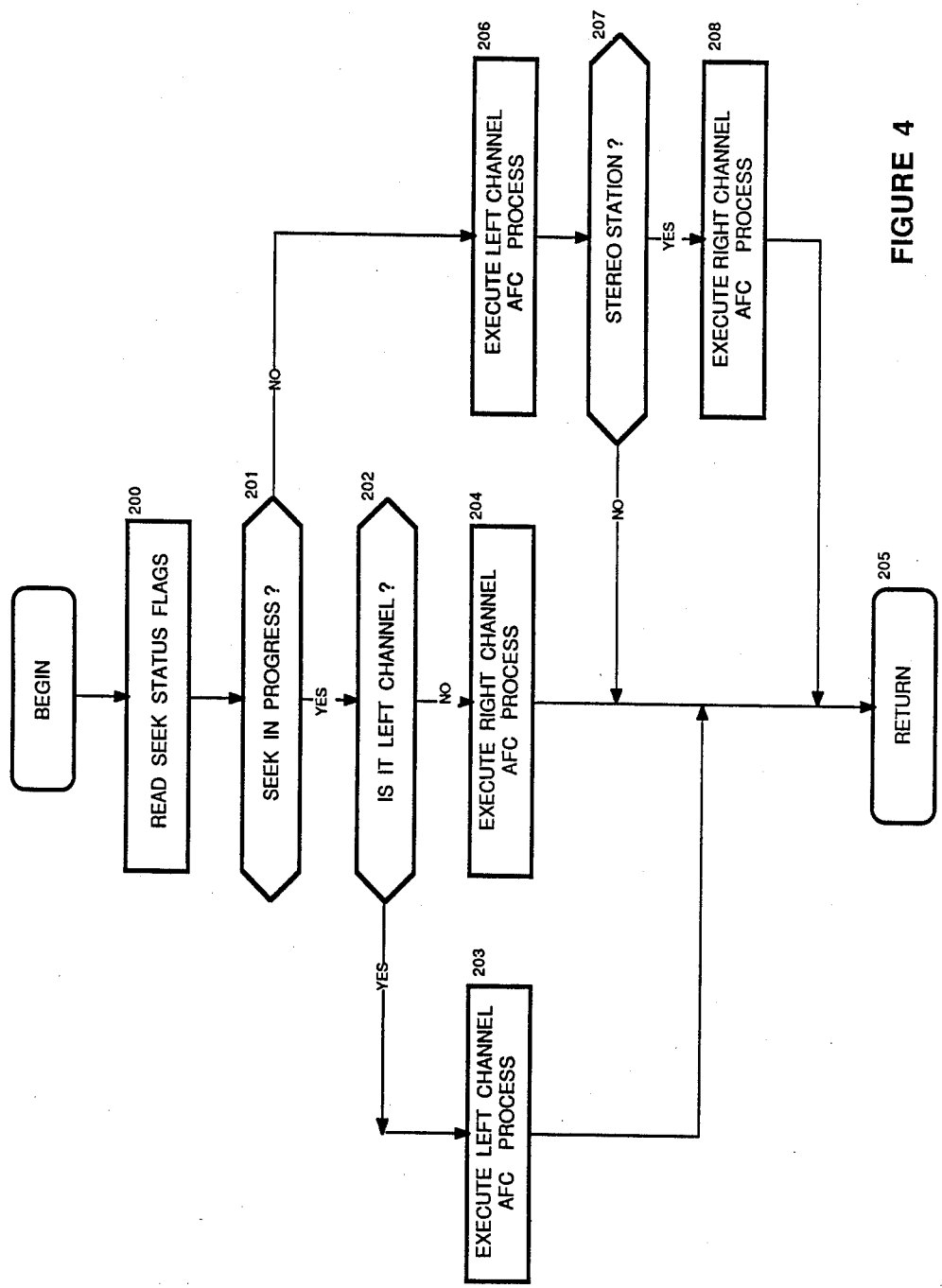
FIG. 4 is a flow chart of a software program for controlling the programmable microprocessor in the tuner of FIG. 2 to execute an "AFC" subroutine.

The subroutine of FIG. 4 is entered at step 200 where a pair of "seek status" flags, to be described below, are read. These flags indicate whether a seek process is already in progress, as determined at step 201 of the subroutine of FIG. 4. If the answer is affirmative, the system advances to step 202 to determine whether it is the "left channel" audio signal that is being sought, which again is indicated by the "seek status" flags read at step 200. An affirmative answer at step 202 advances the system to step 203 where a left-channel AFC process is executed by the subroutine illustrated in FIG. 5, which will be described below. A negative response at step 202 indicates that the seek process in progress is not for the left channel, and thus the system is advanced to step 204 where a right-channel AFC process is executed; this process is not illustrated in the flow charts because it is identical to the process illustrated in FIG. 5 for left-channel centering, except that all the signals involved are right-channel signals rather than left-channel signals. The subroutine then returns to the main program at step 205.

Figure 5:
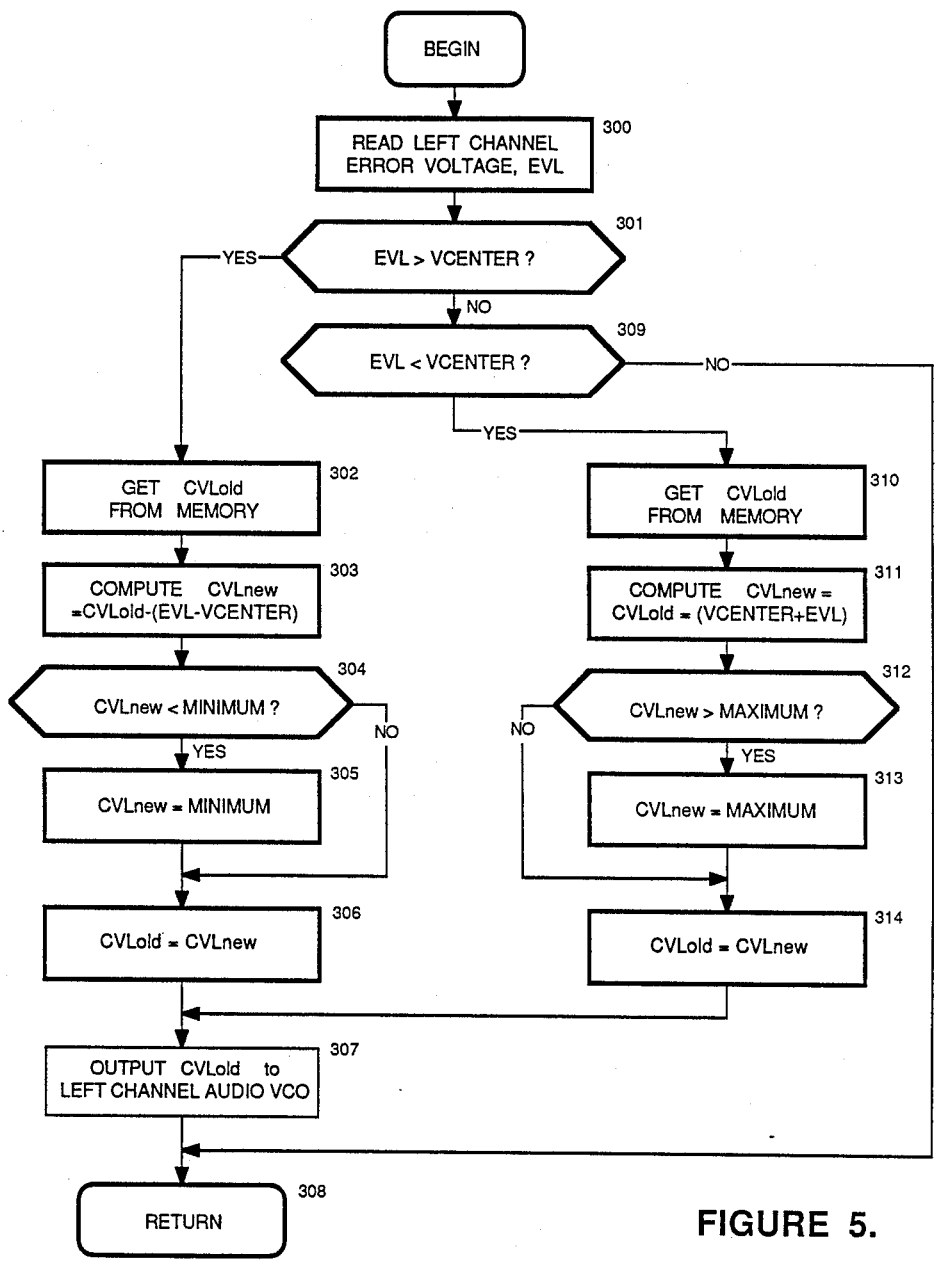
FIG. 5 is a flow chart of a software program for controlling the programmable microprocessor in the tuner of FIG. 2 to execute a "left-channel AFC" subroutine.

If step 201 determines that a seek process is not is progress, the subroutine of FIG. 4 advances to step 206 to execute the left-channel centering process illustrated in FIG. 5, i.e., the same process executed at step 203; it is the left channel that is used for monaural transmissions, and thus step 206 ensures that the AFC function is carred out when a monaural transmission is being received and when an "Audio Seek" process is not being executed. Upon completion of the left-channel AFC process illustrated in FIG. 5, the system returns to the subroutine of FIG. 4 where step 207 determines whether the receiver is in a stereo mode. The data read at this step can either be stored in memory or generated by a user input. If the answer at step 107 is negative, the subroutine returns to the main program at step 205. If the answer at step 207 is affirmative, this subroutine executes a right-channel AFC process at step 208, and then returns to the main program at step 205.

FIG. 5 illustrates the left-channel AFC process, by which the microprocessor achieves the same result as a normal AFC circuit. As indicated above, there is a counterpart subroutine, not illustrated in the drawings, for a right-channel AFC process which is identical to the left-channel AFC process, except that the right-channel signals CVR and EVR are used in place of the left-channel signals CVL and EVL The left-channel AFC process illustrated in FIG. 5 is entered at step 300, where the left-channel error voltage EVL is read. Step 301 then determines whether the current value of EVL is greater than the "locked" value VCENTER, i.e., the value of the error voltage when the frequency of the IF output of the mixer 22 is exactly 10.7 MHz. An affirmative answer at step 301 indicates that the output frequency of the left-channel audio VCO 20 is too high and, therefore, that the controlling input voltage CVL to the left-channel VCO 20 should be reduced.

In order to reduce CVL, the system proceeds to step 302 where the current value of the voltage CVL, designated $CVL_{old}$, is retrieved from memory, and then to step 303 where a desired new value for the voltage CVL, designated $CVL_{new}$, is computed as the current value $CVL_{old}$ minus the value (EVL−VCENTER). Step 304 then determines whether the new value CVL is below a value MINIMUM representing the lower end of the tuning range, below which no audio subcarriers will be found (e.g., 4.5 MHz). If the answer at step 304 is affirmative, the value of $CVL_{new}$ is set equal to MINIMUM at step 305, and the subroutine advances to step 306, which is also reached directly by a negative response at step 304. Step 306 updates the current value of CVL by setting $CVL_{old}$ equal to $CVL_{new}$. This updated value of CVL is then sent to the DAC 33 for the left-channel audio VCO 20 at step 307, after which the subroutine returns to the main program at step 308.

The specific audio frequency to which the receiver is tuned is always displayed on the front panel of the receiver. Thus, whenever the microprocessor determines that one of the audio VCO's is at the end of the tuning range, as at step 304 described above, the frequency display will remain constant and thereby indicate to the user that the system is at the end of the tuning range. Thus, there is no point in continuing to adjust the frequency any farther in that direction.

Returning to step 301 of the subroutine of FIG. 5, a negative answer at this step advances the system to step 309 which determines whether the current voltage EVL is less than the value VCENTER. Negative answers at both steps 301 and 309 indicate that the audio IF frequency is exactly where it should be and no AFC correction is required, and thus the subroutine returns immediately to the main process at step 308. An affirmative answer at step 309, on the other hand, advances the system to step 310 where the current value CVL is read from the memory.

The subroutine of FIG. 5 then advances to step 311 where a desired new value $CVL_{new}$ is computed as the current value $CVL_{old}$ plus the value (VCENTER - EVL). Step 312 determines whether the new value $CVL_{new}$ is above a value MAXIMUM representing the upper end of the tuning range, above which no audio subcarriers will be found (e.g., 8.5 MHz). If the answer at step 312 is affirmative, the value of $CVL_{new}$ is set equal to MAXIMUM at step 313, and the subroutine advances to step 314, which is also reached directly by a negative response at step 312. Step 314 updates the current value of CVL by setting $CVL_{old}$ equal to $CVL_{new}$. This updated value of CVL is then sent to the DAC 33 for the left channel VCO 20 at step 307, after which the subroutine returns to the main process at step 308.

Returning to the main process illustrated in FIG. 3, if an input signal has been generated by the user, step 100 produces an affirmative response which advances the system to step 103 to determine whether the active key sensed at step 100 is an "audio channel" key that is used to select a left or right stereo channel. If the answer is "yes", the system proceeds to step 104 to determine whether the left or right channel has been selected. If it is the left channel, a "left-seek-in-process" flag is set at step 105. If the response at step 104 is negative, indicating that a right channel seek has been selected, the system proceeds to step 106 to set a "right-seek-in-progress" flag.

If the active key sensed at step 100 is not an "audio channel" key, step 103 produces a negative response which advances the system to step 107 to determine whether an "Audio Seek" has been requested. If the answer is negative, the system returns to the beginning of the main process at step 100. An affirmative response at step 107 indicates that an "Audio Seek" command signal is present, and the system proceeds to step 108, where an "audio seek" process is executed by the subroutine of FIG. 6. This subroutine is entered at step 400 where the "seek status" flags set at steps 105 and 106 are read. Step 401 then determines whether the "left-seek-in-progress" flag has been set. If it is the left channel flag that has been set, the answer at step 401 is "yes" and the system advances to step 402 which determines whether the direction of the requested seek is toward higher or lower frequencies, i.e., "up" or "down". If an "up" seek has been requested, step 402 produces an affirmative response which advances the system to step 403 where a new value $CVL_{new}$ for the control voltage for the left-channel VCO 20 is set at a value equal to the sum of the previous value $CVL_{old}$ plus a constant value VSTEP. This value VSTEP preferably represents a control voltage change sufficient to shift the output frequency of the VCO 20 by about 20 KHz. A frequency shift of 20 KHz assures that a narrow subcarrier, e.g. 40-KHz wide, will not be skipped over during the seeking process.

Figure 6:
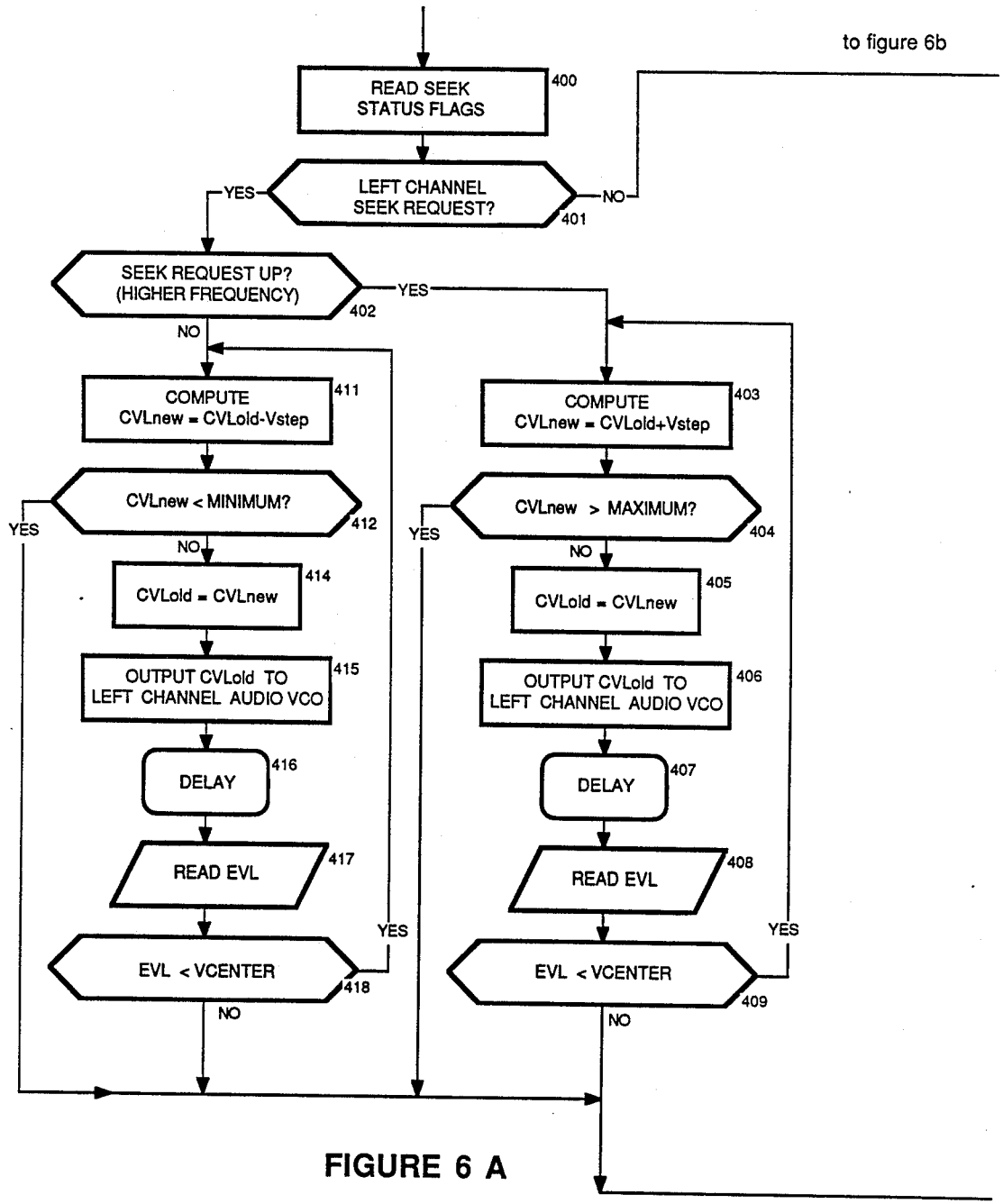
FIGS. 6(a) and 6(b) is a flow chart of a software program for controlling the programmable microprocessor in the tuner of FIG. 2 to execute an "audio seek" subroutine.
Figure 6:
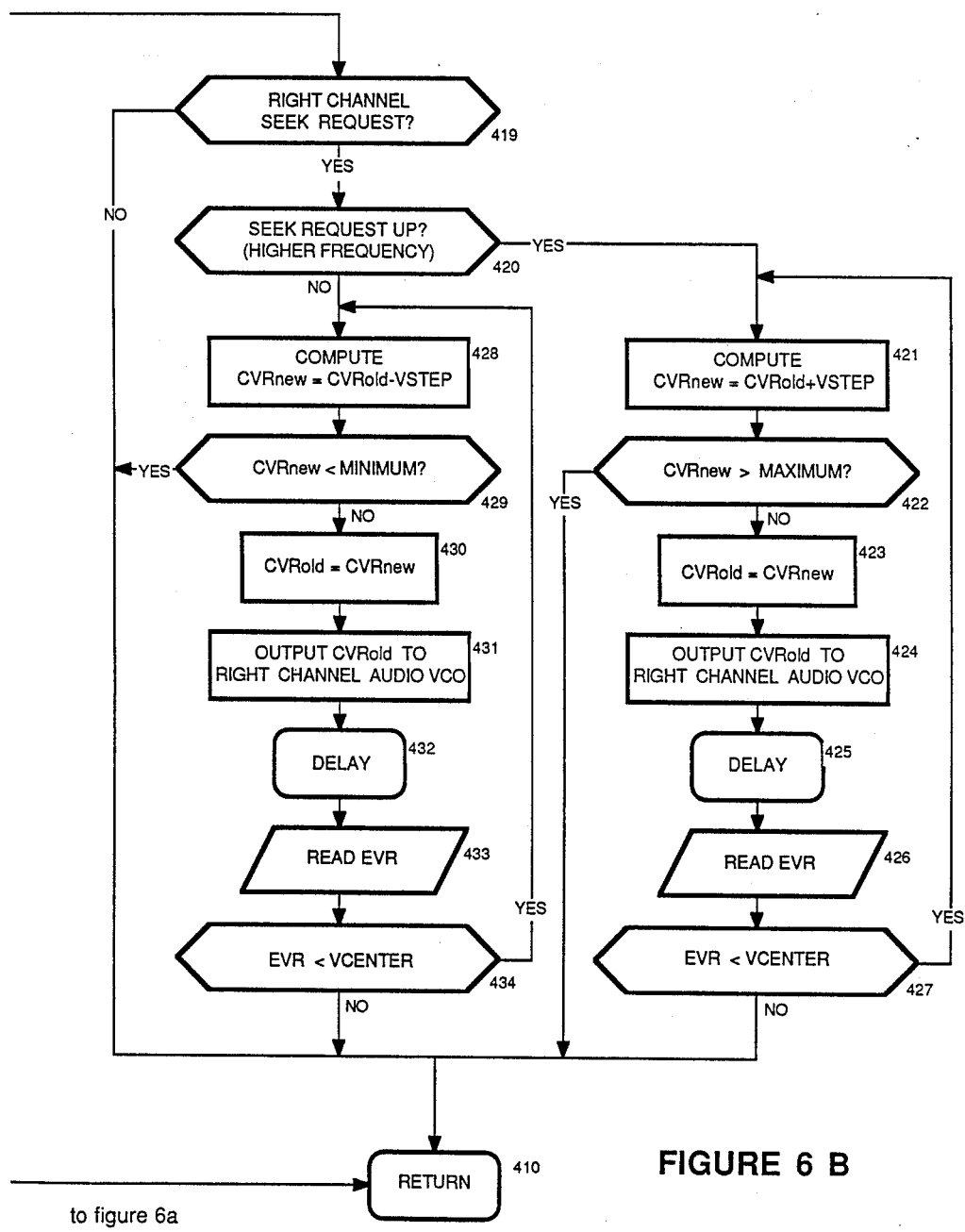

From step 403, the subroutine of FIG. 6 advances to step 404 to determine whether the value $CVL_{new}$ computed at step 403 is above the value MAXIMUM representing the upper end of the tuning range. If the answer is affirmative, the subroutine immediately returns to the main program because there is no point in seeking any higher subcarriers. A negative response at step 404 advances the system to step 405 where the value of CVL is updated by setting $CVL_{old}$ equal to $CVL_{new}$. This updated value of CVL is then supplied to the DAC 33 at step 406 to effect a step change in the voltage input to the left-channel VCO 20.

After the step change has been effected in the VCO input voltage, the subroutine pauses for a suitable delay interval which allows time for the detector 23 to react to the resultant change in the output frequency of the VCO 20. This delay interval is represented by step 407 in the flow chart of FIG. 6. Following the delay, the left-channel error voltage EVL is read at step 408, and then step 409 determines whether the current value of EVL is above the value VCENTER. An affirmative response at step 409 indicates that the error voltage EVL is still trying to return the system to the original subcarrier (i.e., the subcarrier to which the system was tuned before the step change in CVL), and thus the subroutine returns to step 403 to effect another step change in CVL. A negative response at step 409 indicates that a new subcarrier has been located because the error voltage EVL indicates that the input voltage to the VCO 20 should be shifted in the opposite direction. Thus, the subroutine returns to the main process at step 410 to allow the normal AFC function to take over and lock the receiver onto the new subcarrier frequency.

Returning to step 402 of the subroutine of FIG. 6, it will be recalled that this step determined whether an "up" seek was requested by the user. If the answer at step is negative, the subroutine proceeds to step 411 rather than 403 to execute a "down" seek. Step 411 sets CVL to a new value $CVL_{new}$ equal to the sum of the previous value $CVL_{old}$ minus the constant VSTEP.

Step 412 then determines whether the value $CVL_{new}$ computed at step 411 is below the value MINIMUM representing the lower end of the tuning range. If the answer is affirmative, the subroutine immediately returns to the main process because no additional subcarriers will be found at lower frequencies. A negative response at step 412 advances the system to step 414 where the value of CVL is updated by setting $CVL_{old}$ equal to $CVL_{new}$. This updated value of CVL is supplied to the DAC 33 at step 415 to effect a step change in the voltage input to the left-channel VCO 20.

After the step change has been effected in the VCO input voltage, the same delay described above is produced at step 416 to allow time for the detector 23 to react to the resulting change in the VCO output frequency. Following this delay interval, the left-channel error voltage EVL is read at step 417, and then step 418 determines whether the current value of EVL is below the value VCENTER. An affirmative response at step 418 indicates that the error voltage EVL is still trying to return the system to the original subcarrier, and thus the subroutine returns to step 411 to effect another change in CVL. A negative response at step 418 indicates that a new subcarrier has been located because the error voltage EVL indicates that the input voltage to the IF VCO should be shifted in the opposite direction. Thus, the subroutine returns to the main process at step 410 to allow the normal AFC function to lock the receiver onto the new subcarrier frequency.

When step 401 yields a negative answer, the subroutine of FIG. 6 advance to step 419 to determine whether the "right-seek-in-progess" flag has been set. If the answer is "no", it means that a channel has not been selected, and the system returns to the main process at step 410. If step 419 yields a "yes", the subroutine proceeds through steps 420–427 or 428–434, depending upon whether an "up" or "down" right-channel seek has been requested. As can be seen in FIG. 6, these steps are the same as the corresponding left channel steps 402–409 or 411–418 except that the right-channel signals EVR and CVR are substituted for the left-channel signals EVL and CVL.

As can be seen from the foregoing detailed description, the present invention provides an improved satellite receiver system which automatically locates audio signals among the numerous signals received by an earth station. This improved receiver system is particularly useful in TVRO earth stations because it eliminates the need for the user to manually scan the transmissions received from each different transponder to locate the audio signals embedded therein. This receiver locates the audio subcarriers quickly and reliably in response to a command signal, without any further manual intervention after the command signal is generated. The overall cost of the receiver system is not significantly effected, because the features of the invention are simple and inexpensive to implement in an otherwise standard satellite receiver. Finally, the receiver system does not require any input data or other intelligence concerning the frequencies or bandwidths of the audio signals.

What is claimed is:

1. An audio tuning system for receiving and tuning audio subcarrier signals in a TVRO system receiving RF signals from communication satellites, converting the RF signals to an IF frequency range, and demodulating the IF signals, said audio tuning system comprising, a super heterodyne circuit producing an output signal, said circuit including a voltage-controlled oscillator VCO, and mixer for combining the demodulated IF signals with the output of said VCO to convert the frequency of the demodulated IF signals to desired frequencies in an audio IF frequency range, a detector for detecting an audio signal at a prescribed audio IF frequency in the output of said super heterodyne circuit, said detector including automatic frequency control (AFC) means responsive to the audio IF output of said mixer for producing an error voltage representing any difference between the actual and desired frequencies of said audio IF output, means for adjusting the controlling input voltage to said VCO in response to said error voltage to eliminate said difference between the actual and desired frequencies of said audio IF output by adjusting the frequency of the output of said VCO, means for generating an "audio seek" command signal, and means responsive to said "audio seek" command signal for artificially adjusting the controlling input voltage to said VCO in a preselected direction independently of said error voltage, monitoring the resulting error voltage produced by said AFC means in response to said artificial adjustment of said controlling input voltage, continuing to artificially adjust the controlling input voltage to said VCO in said preselected direction in response to monotonic changes in the resulting error voltage, and terminating the artificial adjustments of the controlling input voltage to said VCO in response to a non-monotonic change in the resulting error voltage, whereby the normal operation of said AFC means causes the heterodyne circuit to lock on to a new audio signal to produce the desired audio IF output.

2. The audio tuning system of claim 1 wherein said AFC means is a phase locked loop including a second voltage controlled oscillator operating at a fixed frequency, and a phase detector receiving the output of said second voltage controlled oscillator and the audio IF output of said mixer and producing said error voltage in response to a difference between said outputs received by said phase detector.

3. The audio tuning system of claim 1, wherein said means responsive to said "audio seek" command comprises a microprocessor receiving said error voltage and programmed to artificially increase the controlling input voltage to said VCO by a preselected increment in response to said "audio seek" command.

4. The audio tuning system of claim 3 wherein said miciroprocessor is also programmed to continue to artificially increase the controlling intput voltage to said VCO as long as the resulting error voltage changes monotonically.

5. The audio tuning system of claim 3 wherein said means for adjusting the controlling input voltage to said VCO in response to said error voltage also comprises said microprocessor.

6. The audio tuning system of claim 1 wherein said artificial adjustments of the controlling input voltage to said VCO are effected in steps, each of which changes the output frequency of said VCO by about 20 KHz.

7. The audio tuning system of claim 1 which includes means for limiting the continuing adjustments of said controlling input voltage in each direction so that the seeking of a new audio signal is confined to a selected range.

* * * * *